US008991332B2

(12) United States Patent
Kuppurao et al.

(10) Patent No.: US 8,991,332 B2
(45) Date of Patent: Mar. 31, 2015

(54) APPARATUS TO CONTROL SEMICONDUCTOR FILM DEPOSITION CHARACTERISTICS

(75) Inventors: Satheesh Kuppurao, San Jose, CA (US); David K. Carlson, San Jose, CA (US); Manish Hemkar, Sunnyvale, CA (US); Andrew Lam, San Francisco, CA (US); Errol Sanchez, Tracy, CA (US); Howard Beckford, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1231 days.

(21) Appl. No.: 12/394,203

(22) Filed: Feb. 27, 2009

(65) Prior Publication Data

US 2009/0211523 A1 Aug. 27, 2009

Related U.S. Application Data

(62) Division of application No. 11/205,647, filed on Aug. 17, 2005.

(51) Int. Cl.
C23C 16/46 (2006.01)
C23C 16/52 (2006.01)
C23C 16/44 (2006.01)
H01L 21/67 (2006.01)

(52) U.S. Cl.
CPC ............ *C23C 16/46* (2013.01); *C23C 16/4411* (2013.01); *C23C 16/52* (2013.01); *H01L 21/67115* (2013.01); *H01L 21/67248* (2013.01)
USPC ........... 118/697; 118/666; 118/696; 118/724; 156/345.27; 156/345.37

(58) Field of Classification Search
CPC ..... C23C 16/46; C23C 16/52; C23C 16/4411; H01L 21/67115; H01L 21/67248
USPC ............. 118/724, 666, 697, 696; 156/345.27, 156/345.37
See application file for complete search history.

(56) References Cited

U.S. PATENT DOCUMENTS

| 4,464,222 | A |   | 8/1984 | Gutsche |         |
|-----------|---|---|--------|---------|---------|
| 4,753,192 | A | * | 6/1988 | Goldsmith et al. | 118/725 |
| 4,754,404 | A |   | 6/1988 | Inoue   |         |
| 4,802,441 | A | * | 2/1989 | Waugh   | 118/666 |
| 4,920,918 | A | * | 5/1990 | Adams et al. | 118/724 |
| 5,097,890 | A | * | 3/1992 | Nakao   | 165/206 |
| 5,108,792 | A |   | 4/1992 | Anderson et al. |  |

(Continued)

FOREIGN PATENT DOCUMENTS

EP 1160353 A1 5/2001
EP 1160353    12/2001

(Continued)

OTHER PUBLICATIONS

Non-Final Office Action in U.S. Appl. No. 11/205,647, (May 15, 2009), 13 pgs.

(Continued)

*Primary Examiner* — Jeffrie R Lund
(74) *Attorney, Agent, or Firm* — Servilla Whitney LLC

(57) ABSTRACT

Systems and apparatus are disclosed for adjusting the temperature of at least a portion of the surface of a reaction chamber during a film formation process to control film properties. More than one portion of the chamber surface may be temperature-modulated.

16 Claims, 9 Drawing Sheets

(56) References Cited

U.S. PATENT DOCUMENTS

| | | | |
|---|---|---|---|
| 5,179,677 A * | 1/1993 | Anderson et al. | 392/411 |
| 5,258,824 A | 11/1993 | Carlson et al. | |
| 5,421,957 A * | 6/1995 | Carlson et al. | 216/58 |
| 5,519,319 A * | 5/1996 | Smith et al. | 324/306 |
| 5,540,777 A | 7/1996 | Barbee et al. | |
| 5,592,581 A | 1/1997 | Okase | |
| 5,650,082 A * | 7/1997 | Anderson | 219/390 |
| 5,675,253 A * | 10/1997 | Smith et al. | 324/306 |
| 5,690,050 A * | 11/1997 | Doi | 118/723 MP |
| 5,800,878 A * | 9/1998 | Yao | 427/573 |
| 5,855,677 A | 1/1999 | Carlson et al. | |
| 6,015,465 A * | 1/2000 | Kholodenko et al. | 118/719 |
| 6,026,896 A * | 2/2000 | Hunter | 165/206 |
| 6,064,799 A * | 5/2000 | Anderson et al. | 392/416 |
| 6,083,323 A | 7/2000 | Carlson et al. | |
| 6,211,081 B1 | 4/2001 | Mikata | |
| 6,326,597 B1 * | 12/2001 | Lubomirsky et al. | 219/494 |
| 6,367,410 B1 * | 4/2002 | Leahey et al. | 118/723 I |
| 6,482,331 B2 * | 11/2002 | Lu et al. | 216/67 |
| 6,666,924 B1 | 12/2003 | van Bilsen | |
| 6,705,095 B2 * | 3/2004 | Thompson et al. | 62/117 |
| 6,833,322 B2 * | 12/2004 | Anderson et al. | 438/680 |
| 6,881,277 B2 | 4/2005 | Pan | |
| 6,939,579 B2 | 9/2005 | Bondestam et al. | |
| 7,038,173 B2 * | 5/2006 | Takahashi et al. | 219/390 |
| 7,112,351 B2 | 9/2006 | Affinito | |
| 7,718,225 B2 * | 5/2010 | Kuppurao et al. | 427/248.1 |
| 2002/0157611 A1 | 10/2002 | Bondestam et al. | |
| 2002/0192375 A1 | 12/2002 | Sun et al. | |
| 2003/0066482 A1 | 4/2003 | Pokharna et al. | |
| 2007/0042117 A1 * | 2/2007 | Kuppurao et al. | 427/248.1 |
| 2007/0091538 A1 * | 4/2007 | Buchberger et al. | 361/234 |
| 2009/0211523 A1 * | 8/2009 | Kuppurao et al. | 118/697 |

FOREIGN PATENT DOCUMENTS

| | | |
|---|---|---|
| JP | 04-245419 | 9/1992 |
| JP | 06-260415 | 9/1994 |
| JP | 07-37827 | 2/1995 |
| JP | 2002-353154 | 12/2002 |

OTHER PUBLICATIONS

Ducati, Caterina et al., "Temperature selective growth of carbon nanotubes by chemical vapor deposition", *Journal of Applied Physics*, vol. 92, No. 6, (Sep. 15, 2002), 5 pgs.

Zhang, Jian-Yun et al., "Thermodynamics analyses of the effect of $CH_3$ and $C_2H_2$ on morphology of CVD diamond films", *Thin Solid Films 368*, (2000), 3 pgs.

Kim, Han-Su et al., "Surface Modification Using CVD-SiC", *Dept. of Ceram. Eng., Yonsei Univ.*, (Mar. 23, 1996), 10 pgs.

PCT International Search Report & Written Opinion, dated Mar. 24, 2008, International Application No. PCT/US06/30913, 9 pp.

* cited by examiner

APPARATUS TO CONTROL SEMICONDUCTOR FILM DEPOSITION CHARACTERISTICS

This application is a divisional under 35 U.S.C. §121 of U.S. application Ser. No. 11/205,647, filed Aug. 17, 2005, the disclosure of which is hereby incorporated by reference in its entirety.

BACKGROUND

Embodiments of the present invention pertain to the formation of films on a substrate. These films, including but not limited to Si, SiGe, SiC and SiGeC, in both their doped and undoped forms, are used in the manufacture of advanced electronic components. Such films exhibit various properties, such as morphology and doping concentrations, which must be controlled to within certain tolerances. The advances exhibited in electronics over the past few decades are the direct result of the ability of semiconductor foundries to increase circuit pattern densities. As these pattern densities increase, the tolerances for the thin films required to make the circuits become increasingly strict. Therefore, careful control of the formation of thin films, and the resultant properties of such films, is essential for continued advances in electronics. These aforementioned films are typically made in an apparatus of the type shown and described in U.S. Pat. No. 6,083,323.

A substrate typically has a top face upon which a film can be formed and a bottom face. To grow the film, the substrate is placed into a reaction chamber. The top face of the substrate faces a top surface of the reaction chamber; similarly, the bottom face of the substrate faces a bottom surface of the reaction chamber. During the film formation process, the substrate is heated according to process parameters.

As noted above, it would be desirable to provide methods and apparatus for providing improved control of film characteristics, including but not limited to growth rate, morphology, faceting, doping distributions, etc. It is also desirable to provide methods and systems that provide a high level of process repeatability.

SUMMARY

Aspects of the present invention provide methods, apparatus and systems, for forming thin films on a substrate. During the film formation process, the substrate is heated according to process parameters. Also, during the formation process, the temperature of at least a portion of the surface of the reaction chamber is modulated so that the temperature of this surface varies with the process time in a predetermined manner. This temperature-modulated portion of the reaction chamber surface may be the top surface, the bottom surface, adjacent surfaces or the entire chamber surface. In one embodiment, the temperatures of a plurality of surfaces in the reaction chamber are individually modulated. In one embodiment, the top surface is modulated according to a first temperature parameter, and the bottom surface is modulated according to a second temperature parameter.

In one embodiment, a system or apparatus for forming films includes a cooling system that can be controlled during the film formation period to regulate the temperature of at least a portion of the reaction chamber surface. In one embodiment, the cooling system utilizes one or more set-points to set the level of cooling power employed by the cooling system to adjust the temperature modulated portion of the reaction chamber surface during the film formation process. In another embodiment, the cooling system employs a temperature feedback loop to adjust the power employed by the cooling system so that the temperature of the cooled surface follows a predetermined, time-dependent trajectory across the film formation processing period.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Novel apparatus and techniques in chamber wall temperature regulation to improve the manufacturing of advanced electronics, such as transistor applications in the 65 nm and 45 nm technology nodes are disclosed. Improvements in growth rate and reduced faceting have been observed, and based upon these observations, improvements in yield, film quality and process repeatability are expected to be obtained. Improvements are particularly expected in low temperature film formation processes where the process temperatures are less than 850° C., or where films are formed on patterned wafers, or where high dopant concentration films (in the range of 1%) are formed. These improvements can be achieved without affecting other important film parameters and morphology, and which may be practiced in any device adapted for the growth or deposition of films, such as the Epi Centura® 300 mm CVD system of Applied Materials, Inc., providing an additional control parameter for controlling growth kinetics.

For purposes of the following disclosure, a film formation process spans the entire period of time, termed the processing period, between the insertion of a substrate into a processing chamber, and the extraction of the substrate from the processing chamber. A single process may incorporate one or more steps; for example, a process may include a pre-clean/surface conditioning step, a film deposition step, and a cool-down step. The invention may be applied, for example, to epitaxial and polycrystalline or amorphous film deposition processes, such as Si, SiGe, SiC (carbon doped silicon), SiGeC (in doped or undoped forms), silicon nitride and other compound semiconductor films (which may include III-V or II-IV materials), and may be broadly applied to other processes.

Figure 1:
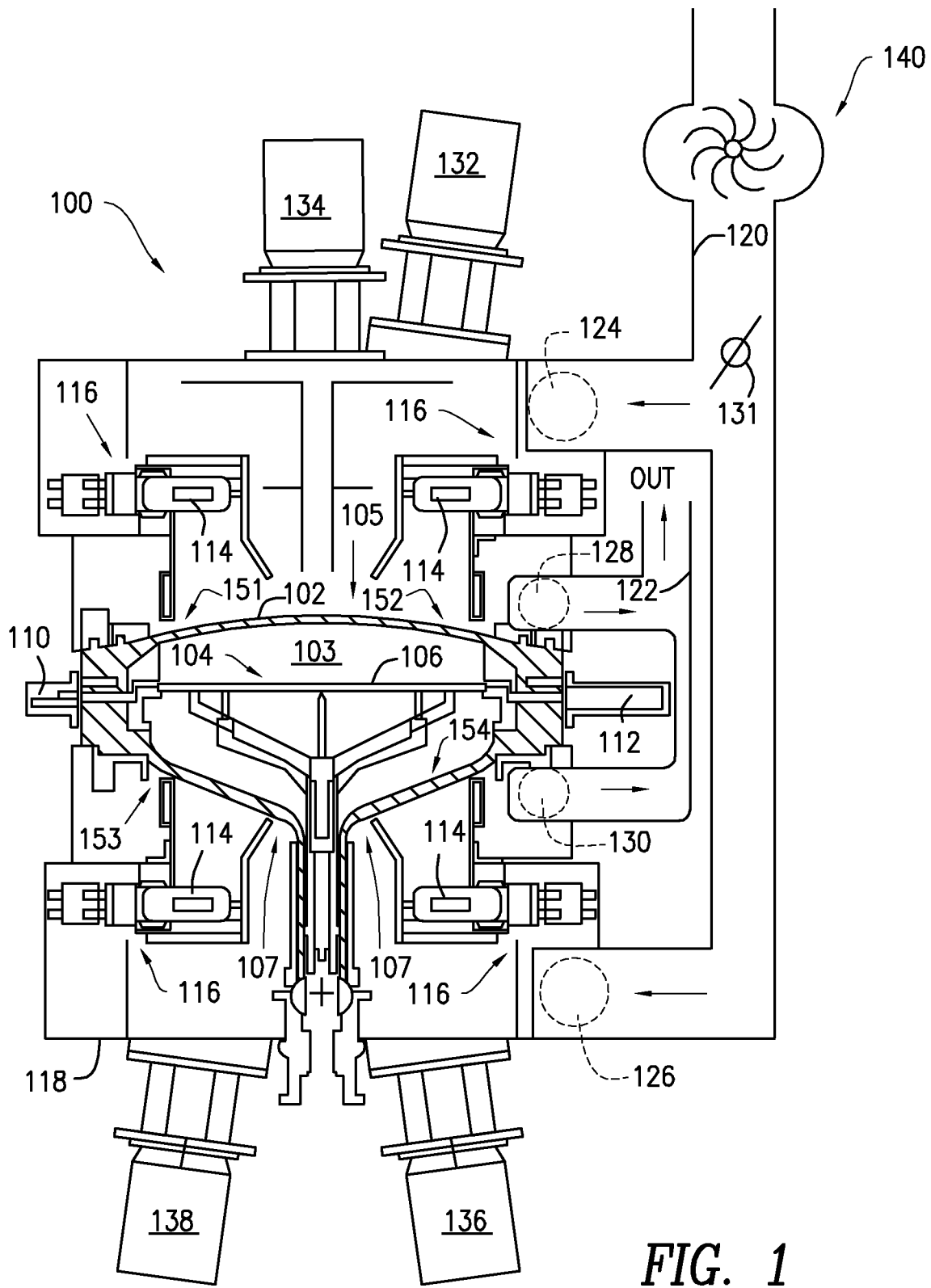
FIG. 1 shows a cross-sectional view of a first embodiment of a thermal reaction chamber.

FIG. 1 shows a cross-sectional view of a thermal reaction chamber 103 used in a first embodiment chemical film formation system 100. The chamber 103 has chamber walls 102 that define the inner volume of the chamber 103 in which reactive film formation processes are accomplished, such as suitable deposition processes, including but not limited to CVD. A housing 118 envelopes and supports the chamber walls 102. A substrate support structure 104 is used to support a substrate 106 within the chamber 103 during CVD processing. The substrate 106 has a top face upon which a film is to be deposited or grown, and this top face typically faces away from the substrate support structure 104, although this is not a requirement. Hence, the bottom face of the substrate 106 typically faces, and contacts, the substrate support structure 104.

During processing, gases enter the chamber 103 through an entry port 110 and are removed through an exhaust port 112. Also during processing, heat is provided by infrared radiation bulbs 114. The infrared radiation bulbs 114 are mounted proximate the chamber walls 102, on a support assembly 116 connected to the housing 118. The chamber walls 102 of the chamber 103 are transparent, typically made of quartz, and allow infrared radiation from the radiation bulbs 114 to freely enter the reaction chamber 103 to heat the substrate 106. The chamber walls 102 have a top surface 105 that faces the top face of the substrate 106, and a bottom surface 107 that faces the bottom face of the substrate 106 and the substrate support structure 104.

A more complete description of thermal reactors and their operation is disclosed in commonly assigned U.S. Pat. No. 5,258,824 entitled "In-Situ Measurement Of A Thin Film Deposited On A Wafer" and U.S. Pat. No. 5,108,792 entitled "Double-dome Reactor for Semiconductor Processing", the entire contents of each of which is incorporated herein by reference.

During processing, the chamber walls 102, although substantially transparent, still become heated. A coolant flow for cooling the chamber walls 102 is supplied to the housing 118 from a blower 140 via inlet conduit 120, directed past the chamber walls 102 and exhausted through outlet conduit 122. More specifically, the coolant flow is supplied via conduit 120 to housing 118 through upper inlet port 124 and lower inlet port 126. The coolant flow exits the housing 118 through upper exhaust port 128 and lower exhaust port 130. Coolant entering through upper inlet port 124 passes across the top surface 105 of the chamber walls 102 and exits through upper exhaust port 128. Similarly, coolant entering through lower inlet port 126 passes across the bottom surface 107 of the chamber walls 102 and exits through lower exhaust port 130. The housing 118 forms a shroud that channels the coolant past the chamber walls 102. This constant flow of coolant along the chamber walls 102 cools the chamber walls 102 of the reaction chamber 103. Typically, the coolant is air.

Alternate ways of controlling the temperature of the chamber walls 102 may also include water cooling surfaces in contact with the chamber walls 102, or the use of nitrogen, helium, argon or other inert gases flowing across the chamber walls 102. A coolant regulator 131, such as an air vane or other coolant flow control device, located in the inlet conduit 120, controls the amount of coolant flow to the housing 118 and, in turn, controls the temperature of the chamber walls 102. Alternatively, other devices for controlling the coolant flow may be used, such as an adjustable iris, a valve, blower speed control circuitry for the blower 140 and the like. Together, the blower 140 and coolant regulator 131, or other suitable ways as outlined above, provide a cooling system for cooling the chamber walls 102, in which the cooling power provided by the cooling system for the chamber walls 102 is controllable, i.e., the rate of heat removal from the chamber walls 102 may be controlled by the cooling system so as to regulate the temperature of chamber walls 102 in a controlled manner.

The temperature of the chamber walls 102 may be monitored using conventional temperature measuring devices familiar to those in the art, such as optical pyrometers, thermocouples or the like. For example, the temperature of the top surface 105 of the chamber walls 102 may be monitored using optical pyrometer 132; optical pyrometer 134 may be used to measure the temperature of the substrate 106; optical pyrometer 136 may be used to measure the temperature of the substrate support structure 104, and optical pyrometer 138 may be used to monitor the temperature of the bottom surface 107 of the chamber walls 102.

Figure 2:
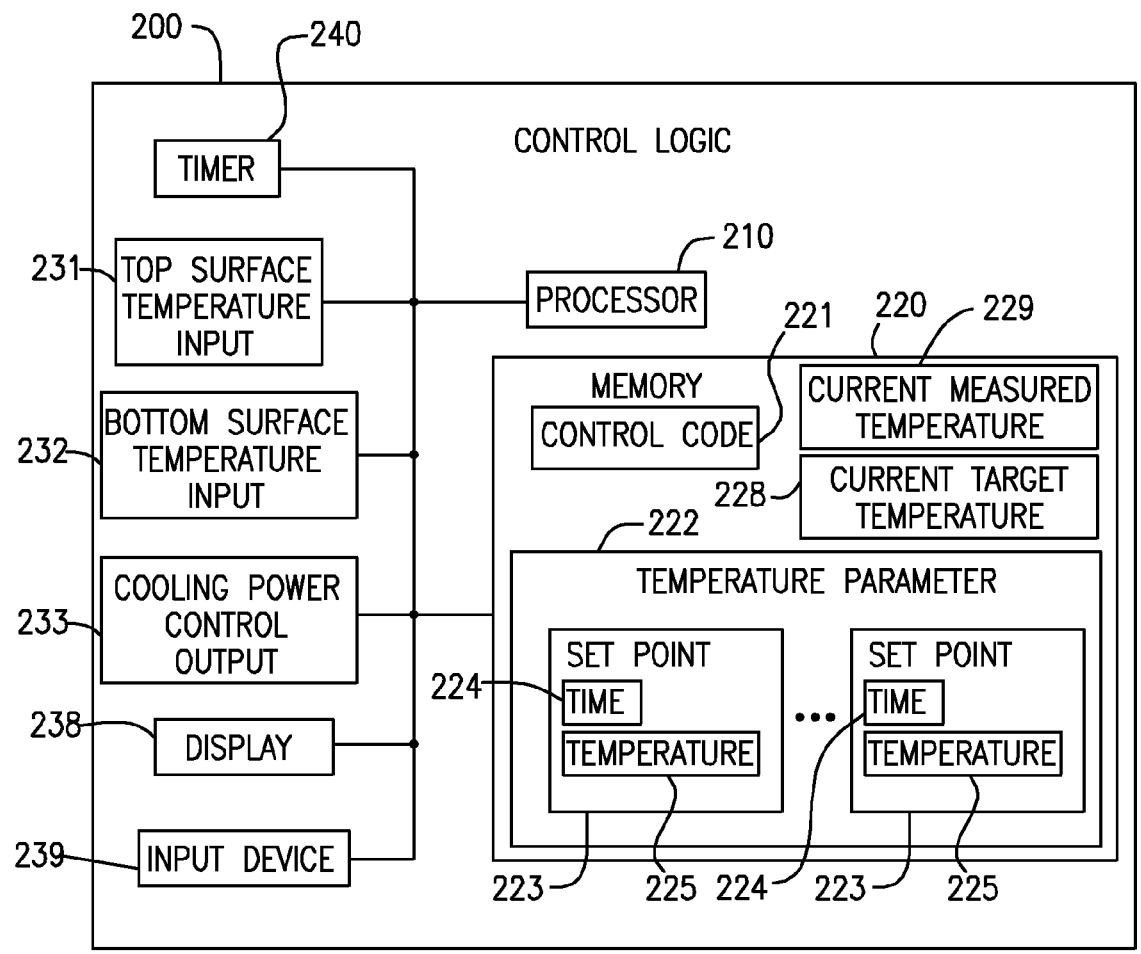
FIG. 2 is a diagram of control logic that can be used in accordance with one or more embodiments.

A first signal, encoding the measured temperature of the top surface 105, is output from the top surface temperature measuring device 132 and received for processing by control logic 200, an embodiment of which is represented in FIG. 2. Similarly, a second signal, encoding the measured temperature of the bottom surface 107, is output from the bottom surface temperature measuring device 138 and received for processing by the control logic 200. The control logic 200 utilizes the first signal, the second signal or a function of the two to control the cooling power of the cooling system so as to modulate the temperature of the chamber walls 102 over the processing period according to a predetermined temperature trajectory.

In one embodiment, the control logic 200 comprises a processor 210 in electrical communications with a memory 220. The memory 220 comprises control code 221, which is executed by the processor 210 and which controls the operations of the processor 210; the control code 221 serves as the operating system for the control logic 200. In the following, when the processor 210 is described as performing an act, it should be understood that it is the control code 221 that causes the processor 210 to perform the act described; providing the control code 221 program should be well within the means of one reasonably skilled in the art.

In the embodiment disclosed in FIG. 2, the processor 210 obtains the temperature of the top surface 105 via a top surface temperature input 231 that receives the first signal from the top surface temperature measuring device 132. Similarly, the processor 210 obtains the temperature of the bottom surface 107 via a bottom surface temperature input 232 that receives the second signal from the bottom surface temperature measuring device 138. The control logic 200 is used, amongst other things, to control the cooling system used to cool the chamber walls 102 so as to modulate the chamber wall 102 temperature over the process period in a predetermined manner, thereby providing an independent parameter for controlling the kinetics of the film formation process. It should be clear, however, that the control logic 200 may contain many other additional inputs that are not indicated in FIG. 2, such as inputs for measuring gas flow rates, substrate 106 and substrate support structure 104 temperatures, etc., as known in the art.

The control logic 200 may be provided a display 238 to present process-relevant information to a user, and an input device 239 to permit the user to enter information into the control logic 200. The processor 210 can control the display 238 to present, for example, the temperatures of the top surface 105, bottom surface 107, substrate 106 and substrate support structure 104, the current process step, the current process time, gas flow rates, etc. Likewise, the processor 210 may change parameters stored within the memory 220 according to data received from the input device 239, with such changes potentially resulting in changes to the process steps executed by the processor 210, and hence changes in the way the processor 210 controls the CVD system 100. The display 238, input device 239, control code 221 and processor 210 together form a user input/output (I/O) interface, in a manner familiar to those in the art, which permits the user to both monitor and control the CVD system 100.

In the embodiment shown, the memory 220 of the control logic 200 also contains a temperature parameter 222 that is used to control and modulate the temperature of at least a portion of the chamber wall 102 over the processing period. The temperature parameter 222 comprises at least one setpoint 223, and typically will have two or more setpoints 223. Each setpoint 223 contains a respective time value 224 and temperature value 225. The time value 224 indicates a time within the processing period, and may be in any format suitable to encode such information, such as a 24-hour time, a process-relative time (i.e., the amount of time elapsed since the beginning of the process, or to the end of the process), a step-relative time (i.e., the amount of time elapsed since the beginning of a current step within the process, or to the end of the step) or the like. The temperature value 225 indicates a temperature that is desired for the temperature-modulated portion of the chamber wall 102 at the related time value 224 in the setpoint 223, and may be in any form suitable to indicate such temperature information; examples include an absolute temperature, as in degrees Celsius or Kelvin, or a relative temperature, as in an offset from a process temperature.

Together, the setpoints 223 provide temperature trajectory information for the temperature-modulated portion of the chamber wall 102 over the processing period. At predetermined intervals during the processing period, such as 0.01 second intervals, the control logic 200 obtains chamber wall 102 temperature information from the temperature inputs 231, 232, and utilizes this information to generate a current measured temperature 229. Any method may be used to generate the current measured temperature 229, such as by averaging, weighted averaging, using only one of the temperature inputs 231, 232, etc. This may be selectable by the user via the user I/O interface. The processor 210 then uses the current time (as obtained from timer 240) and the time values 224 to index into the temperature parameter information 222 to find the closest setpoints 223 between which the current time lies.

Still referring to FIG. 2, next, the processor 210 performs linear interpolation (or any other suitable interpolation), using the associated temperature values 225 of the closest setpoints 223, to determine the current target temperature 228 of the temperature-modulated portion of the chamber wall 102. Typically two setpoints 223 (or one setpoint if before or beyond the minimum and maximum time values 224) are used as the closest setpoints 223, but three or more may be used depending upon the type of interpolation performed. The processor 210 utilizes the current measured temperature 229 and current target temperature 228 as inputs into a standard feed-back loop to control the power level of the cooling system for the temperature-modulated portion of the chamber walls 102 so that the current measured temperature 229 reaches the current target temperature 228. By way of continuous feedback, the current measured temperature 229 as a function of time should substantially track the temperature parameter 222, within measurement errors and the mechanical limitations of the cooling system.

In the embodiments depicted in FIGS. 1 and 2, for example, the processor 210 sends signals to a cooling power control output 233 to control the coolant regulator 131 based upon the measured and target temperatures 229 and 228. If the difference between the current measured temperature 229 and the current target temperature 228 is positive (i.e., the temperature-modulated portion of the chamber wall 102 is currently hotter than desired), then the processor 210 sends a signal to the cooling power control output 233 to open the coolant regulator 131 more to increase the rate of coolant flowing over the chamber walls 102, i.e., to increase the cooling power of the cooling system. Conversely, if the difference is negative, the processor 210 would instruct the coolant regulator 131 to further restrict the flow of coolant, so as to decrease the cooling power of the cooling system. The processor 210 may utilize the magnitude of the difference between the current measured and target temperatures 229, 228 to determine how restrictive or permissive of air flow the coolant regulator 131 should be, i.e., by how much the cooling power should be increased or decreased.

Figure 3:
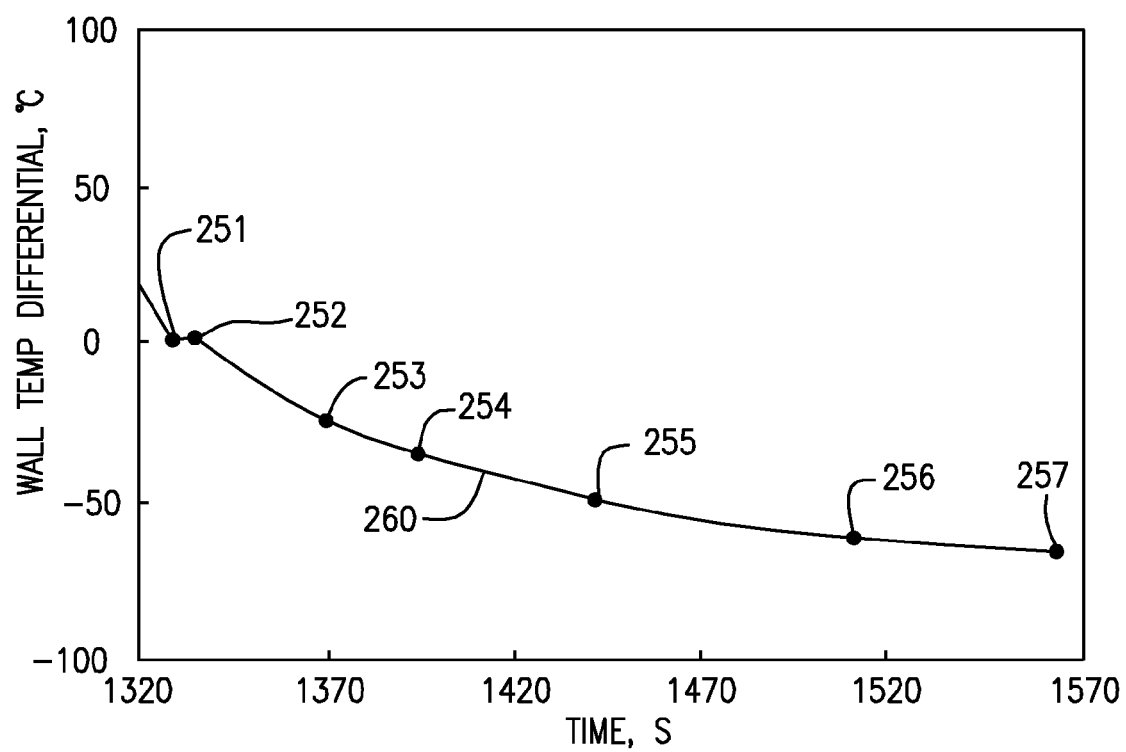
FIG. 3 is a graph illustrating a hypothetical temperature trajectory.

By way of example, FIG. 3 illustrates a hypothetical desired temperature trajectory of the average temperature of the chamber walls 102 over a portion of the processing period. The graph in FIG. 3 is normalized to show temperature differentials with respect to a predefined process temperature, which may be the starting temperature of the film formation step. The user may desire that the chamber walls 102 cool down to the process temperature from a pre-bake step, spend about ten seconds at the process temperature to stabilize, and then, upon the start of the film formation step, begin an asymptotic-like slope down to a temperature that is about 65° C. below the process temperature at the completion of the film formation step. This steadily decreasing temperature of the chamber walls 102 over the film formation step helps to reduce faceting. The user may decide to use six points 252-257 to approximate an asymptotic curve 260, and two points 251, 252 to provide for the ten second temperature stabilization period prior to the film formation step.

If the film formation step begins at a process time of 1340 seconds, the I/O system of the control logic 200 may then be utilized to enter seven corresponding setpoints 223 for the temperature parameter 222: a first setpoint 223 with a time 224 of 1330 and a temperature 225 of 0° C. for a first point 251; a second setpoint 223 with a time 224 of 1340 and a temperature 225 of 0° C. for a second point 252; a third setpoint 223 with a time 224 of 1370 and a temperature 225 of −25° C. for a third point 253; a fourth setpoint 223 with a time 224 of 1405 and a temperature 225 of −35° C. for a fourth point 254; a fifth setpoint 223 with a time 224 of 1440 and a temperature 225 of −45° C. for a fifth point 255; a sixth setpoint 223 with a time 224 of 1510 and a temperature 225 of −60° C. for a sixth point 256, and finally a seventh setpoint 223 with a time 224 of 1560 and a temperature 225 of −65° C. for a seventh point 257. The I/O system might then be utilized to instruct the control logic 200 to use an average value obtained from the top surface temperature input 231 and the bottom surface temperature input 232 to generate the current measured temperature 229. During the film formation process, the control logic 200 would then use the seven setpoints 223 of the temperature parameter 222 to control the coolant regulator 131 so that the current measured temperature 229 tracks the current target temperature 228. Of course, it should be clear that the target temperature 228 in this case is not an actual temperature, but a temperature differential based upon a predefined process temperature. That is, when generating the current measured temperature 229, the control logic 200 may subtract the known, constant process temperature to yield a temperature differential for the current measured temperature 229. For example, at a process time of 1470, as shown in FIG. 3, the control logic 200 would extrapolate between the fifth and sixth setpoints 223 for the fifth point 255 and sixth point 256 to find a current target temperature 228 of 53° C. below the process temperature. The control logic 200 would then send signals to the cooling power control output 233, based upon the current target temperature 228 of −53° C. and the value of the current measured temperature 229, to regulate the cooling system so that the average temperature of the chamber walls 102 tracks the temperature trajectory defined by the setpoints 223. The coolant regulator 131 could also be manually adjusted to control the temperature trajectory of the chamber walls 102.

Figure 4:
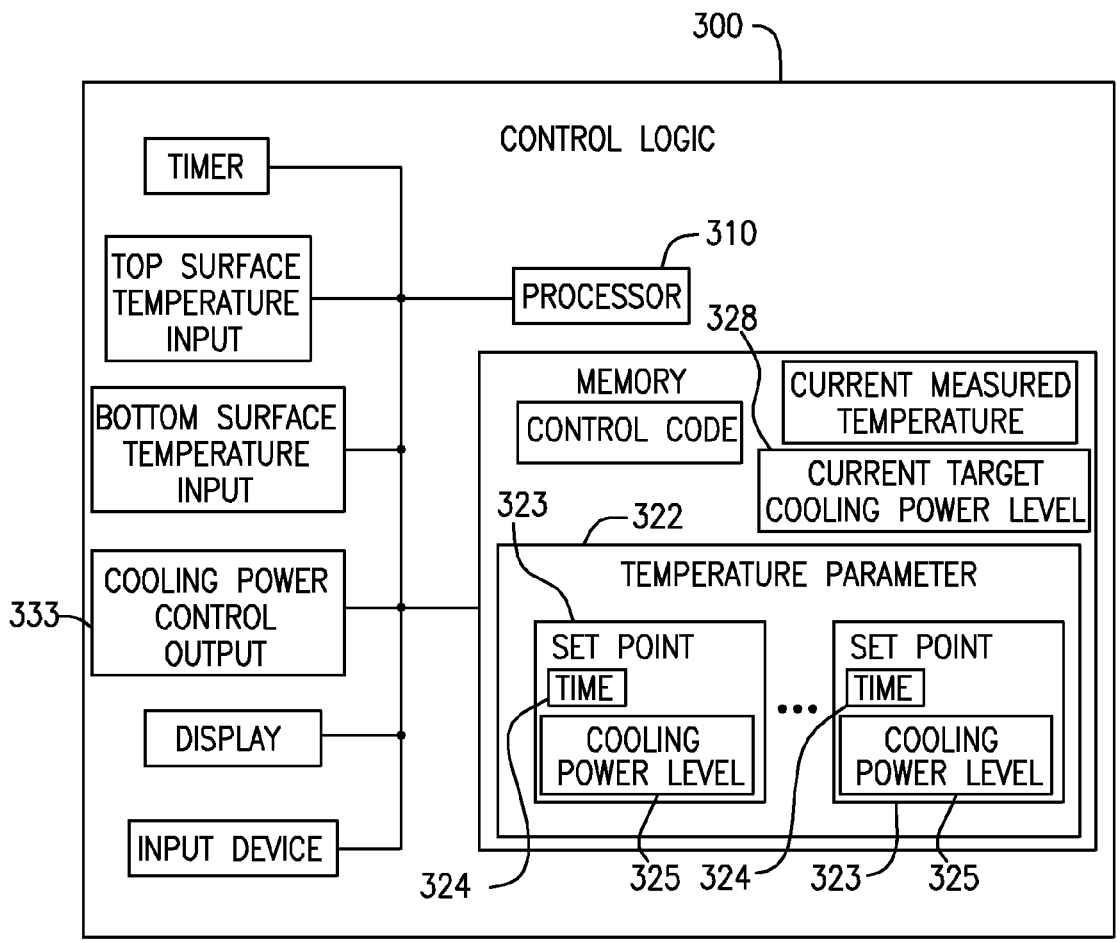
FIG. 4 is a diagram of control logic that can be used according to one or more embodiments.

In the above exemplary embodiment, the setpoints 223 utilize a temperature value 225 to construct the temperature parameter 222 that defines a desired temperature trajectory of the modulated surface of the chamber walls 102 over the processing period. However, with reference to FIG. 4, because there is a tight correlation between the power of the cooling system (i.e., the speed of the blower 140 and/or the setting of the coolant regulator 131) and the radiance of the heating elements 114, as another embodiment it is equally possible to define the temperature parameter 322 as having one or more setpoints 323, each with an associated time value 324 and cooling power level value 325. In this case, the processor 310 of the second embodiment control logic 300 generates a current target cooling power level 328 in a manner analogous to that used above to find the current target temperature 228, and then sends signals to the cooling power control output 333 to set the power of the cooling system (i.e., blower 140 and/or coolant regulator 131) to match the current target cooling power level 328.

Because of the inherent consistency and reproducibility of processing runs, the temperature parameter 322 defined as a series of cooling power levels 325 at respective time values 324 is functionally similar to the temperature parameter 222 of the above embodiment. However, variations between the desired and actual temperatures of the modulated region of the chamber walls 102 may be greater than in the first embodiment.

Embodiments of the present invention provide for controlled modulation of the entire chamber wall 102, or a portion of the chamber wall 102, over the processing period. In particular, as indicated in FIG. 3, the controlled modulation of the chamber wall 102 within individual steps of the film formation process can be achieved. For example, a higher overall growth rate with reduced faceting can be achieved by providing a temperature parameter 222, 322 that initially increases the temperature of the top surface 105, and then slowly decreases the top surface 105 temperature as the deposition or growth of the film on the substrate progresses. Selection of the temperature parameter 222, 322 will depend on the property that is to be optimized. For example, increasing the wall 102 temperature causes gas to crack or decompose better, thereby enhancing the growth rate. Film composition can be varied through this mechanism as well, since some dopant species absorb or incorporate better when decomposed. All of this may be done within a process step, as the film formation procedure goes through various stages. It will thus be understood that the skilled artisan can empirically determine and select the temperature parameter 222, 322 to achieve the desired film properties.

Figure 5:
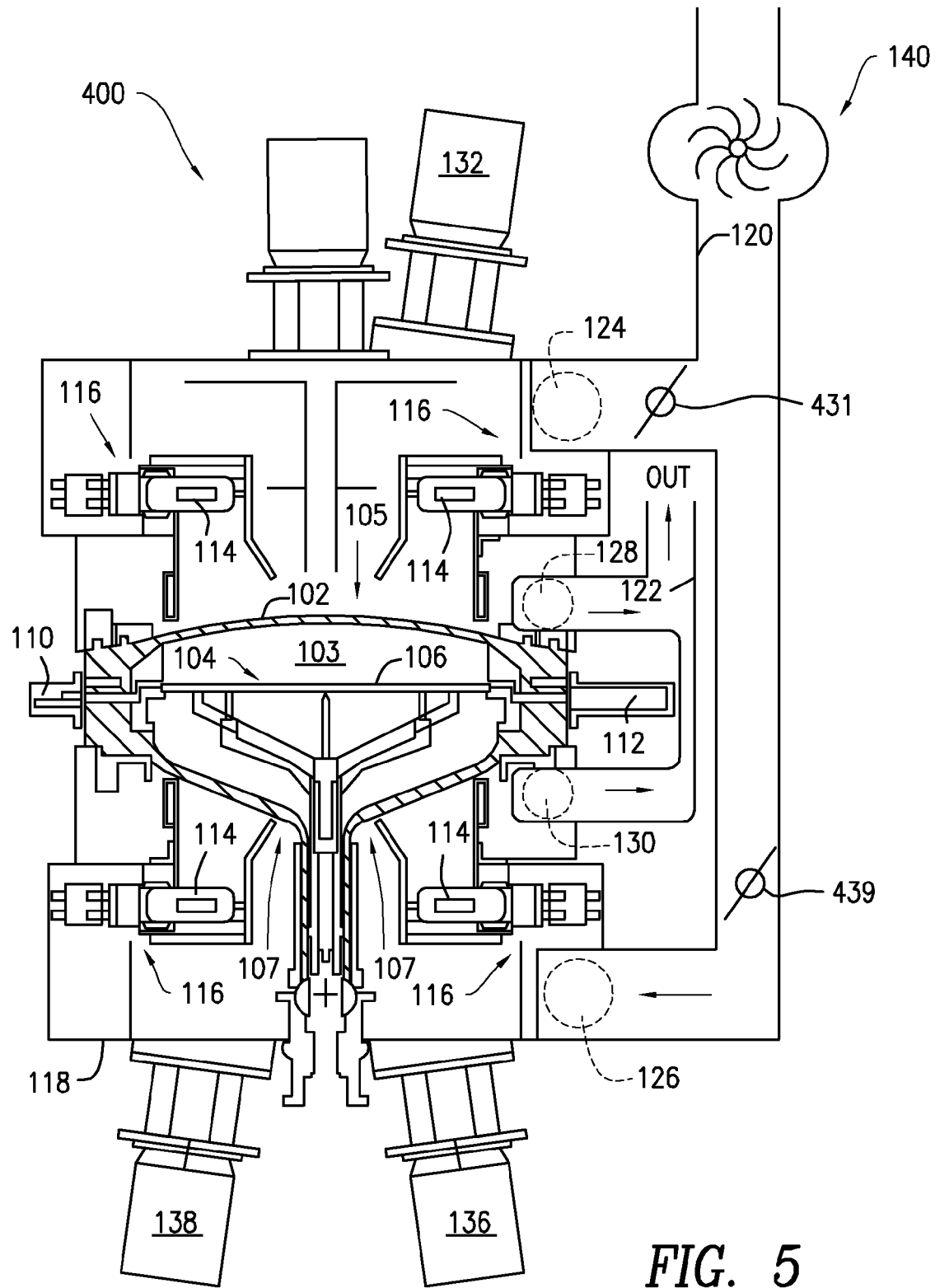
FIG. 5 shows a cross-sectional view of a second embodiment of a thermal reaction chamber.
Figure 6:
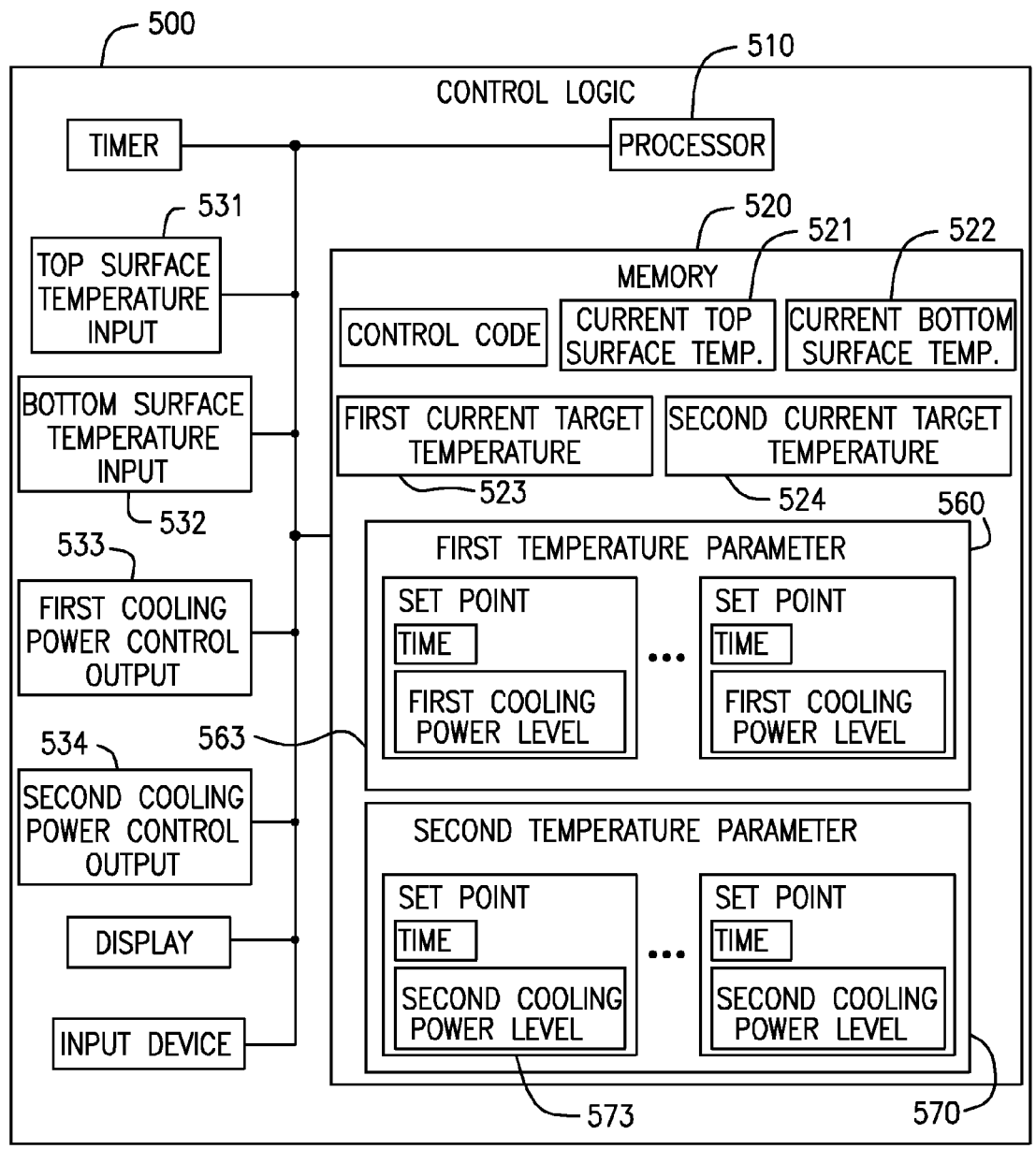
FIG. 6 is a diagram of control logic that can be used according to one or more embodiments.

With reference to FIG. 5 and FIG. 6, a third embodiment system 400 provides additional independent parameters for the film deposition process by allowing independent control of the temperatures of multiple portions of the chamber wall 102. For ease of presentation, components in FIG. 5 that are essentially identical to those in the prior embodiments have been provided the same reference numbers. As indicated in the discussion of FIG. 1, coolant entering inlet port 124 passes across the top surface 105 of the chamber walls 102, thus cooling the top surface 105. Similarly, coolant entering the bottom inlet port 126 cools the bottom surface 107. Hence, by independently controlling the amount of coolant entering the top inlet port 124 and the bottom inlet port 126 it is possible to respectively independently control the temperature of the top surface 105 and the bottom surface 107 of the chamber walls 102. To effectuate this, this embodiment provides a first coolant regulator 431 for controlling the rate of coolant flow into the upper inlet port 124, and a second coolant regulator 439 for controlling the rate of coolant flow into the lower inlet port 126.

The coolant regulators 431, 439 may be air vanes, adjustable irises, valves, liquid-cooled surfaces in contact with their respective chamber wall 102 surfaces, or the like. Alternatively, one of the coolant regulators 431, 439 may be an air vane, adjustable iris, valve, cooled surface or the like, and the other may utilize blower speed control circuitry to control the speed of the blower 140.

Control logic 500 for the embodiment shown in FIG. 5 is analogous to that of the previous embodiments, but provides for independent control of the first coolant regulator 431 and the second coolant regulator 439 according to a first temperature parameter 560 and a second temperature parameter 570, respectively, stored in the memory 520. The first temperature parameter 560 defines a desired temperature trajectory of the top surface 105 over the processing period. The second temperature parameter 570 defines a desired temperature trajectory of the bottom surface 107 over the processing period.

Figure 7:
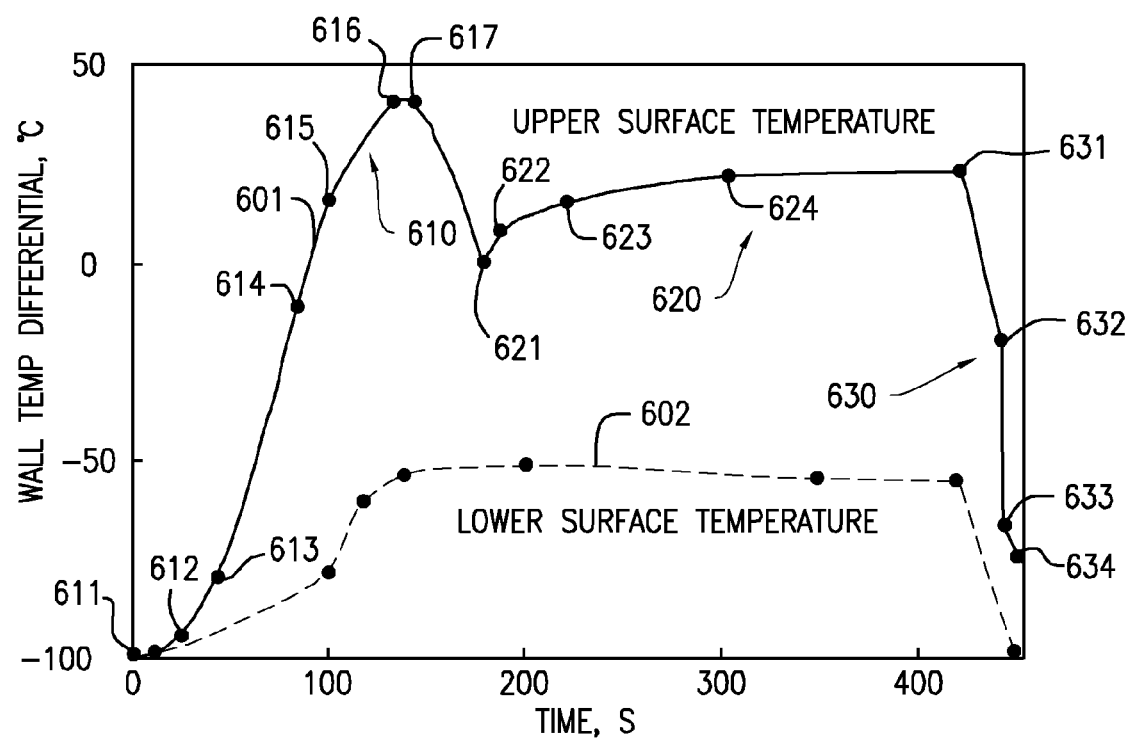
FIG. 7 is a graph illustrating hypothetical first and second temperature trajectories for the embodiment shown in FIGS. 5 and 6.

For example, with reference to FIG. 7, the first temperature parameter 560 may have fifteen setpoints 563 defining a first temperature trajectory 601, analogous to that depicted in FIG. 3, for the top surface 105 relative to the process temperature. For example, seven points 611-617 may comprise a pre-bake temperature trajectory 610 for the top surface 105. Four points 621-624 may comprise a film deposition temperature trajectory 620 for the top surface 105 that increases during the film deposition step. This increase may be substantially asymptotic from the process temperature to a higher target temperature over the time period of the film deposition step. Such an increase in temperature of the top surface 105 during the film deposition step yields higher deposition rates. Four points 631-634 may comprise a cool-down temperature trajectory 630 for the top surface 105.

The second temperature parameter 570 may also have, for example, eight setpoints 573 defining a second temperature trajectory 602 for the bottom surface 107 across the entire film formation process. The processor 510 may utilize the first temperature parameter 560 to generate a first current target temperature 523, and utilize the second temperature parameter 570 to generate a second current target temperature 524. Monitoring of inputs, such as the top surface temperature input 531, which receives first signals from the top surface temperature measuring device 132, enables the processor 510 to generate a current top surface temperature 521. Similarly, by monitoring the bottom surface temperature input 532, which receives second signals from the bottom surface temperature measuring device 138, the processor 510 may generate a current bottom surface temperature 522. Of course, the current top surface temperature 521, as well as the current bottom surface temperature 522, may be a function of a plurality of inputs, as desired by the user.

Analogous to the previous embodiments, the processor 510 utilizes the first current target temperature 523 and the current top surface temperature 521 to send signals to the first cooling power control output 533 to control the first coolant regulator 431, and hence to modulate the top surface 105 temperature according to the first temperature parameter 560. Similarly, the processor 510 utilizes the second current target temperature 524 and the current bottom surface temperature 522 to send signals to the second cooling power control output 534 to control the second coolant regulator 439, and hence to modulate the bottom surface 107 temperature according to the first temperature parameter 560. Of course, the first temperature parameter 560 and the second temperature parameter 570 may be defined by respective cooling power levels rather than temperatures, as is done in the second embodiment, in which case it may not be necessary to monitor the current top surface temperature 521 or the current bottom surface temperature 522 to control the first coolant regulator 431 and the second coolant regulator 439.

Figure 8:
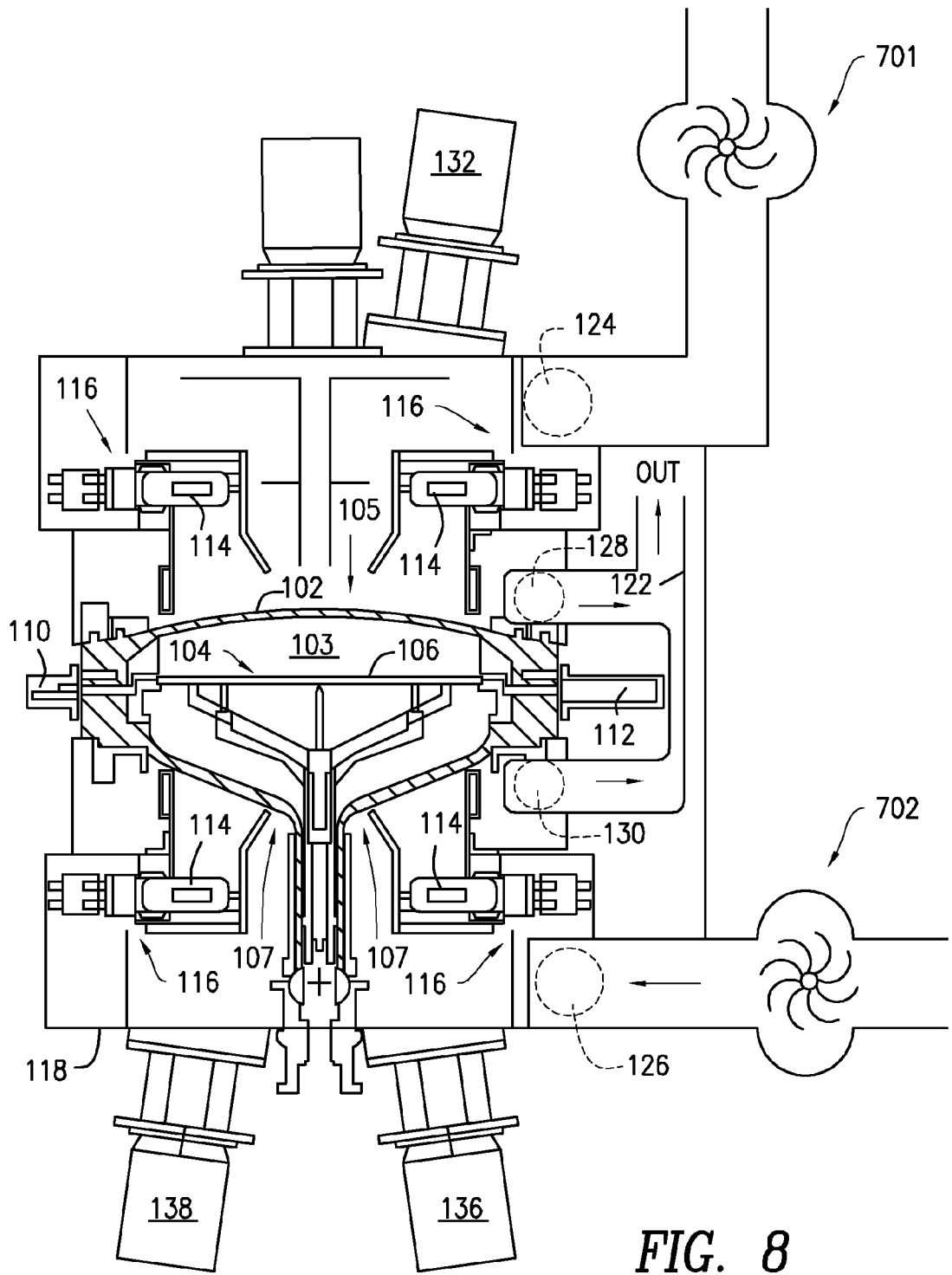
FIG. 8 shows a cross-sectional view of a third embodiment of a thermal reaction chamber.

As shown in FIG. 8, it is possible to use a first variable speed blower 701, and a second variable speed blower 702, to respectively control the temperature of the top surface 105 and bottom surface 107 of the chamber walls 102. With further reference to FIG. 6, the control logic 500 is equally suited to control the embodiment depicted in FIG. 8. First cooling power control output 533 may control the speed of first blower 701, while second cooling power control output 534 may control the speed of second blower 702.

Figure 9:
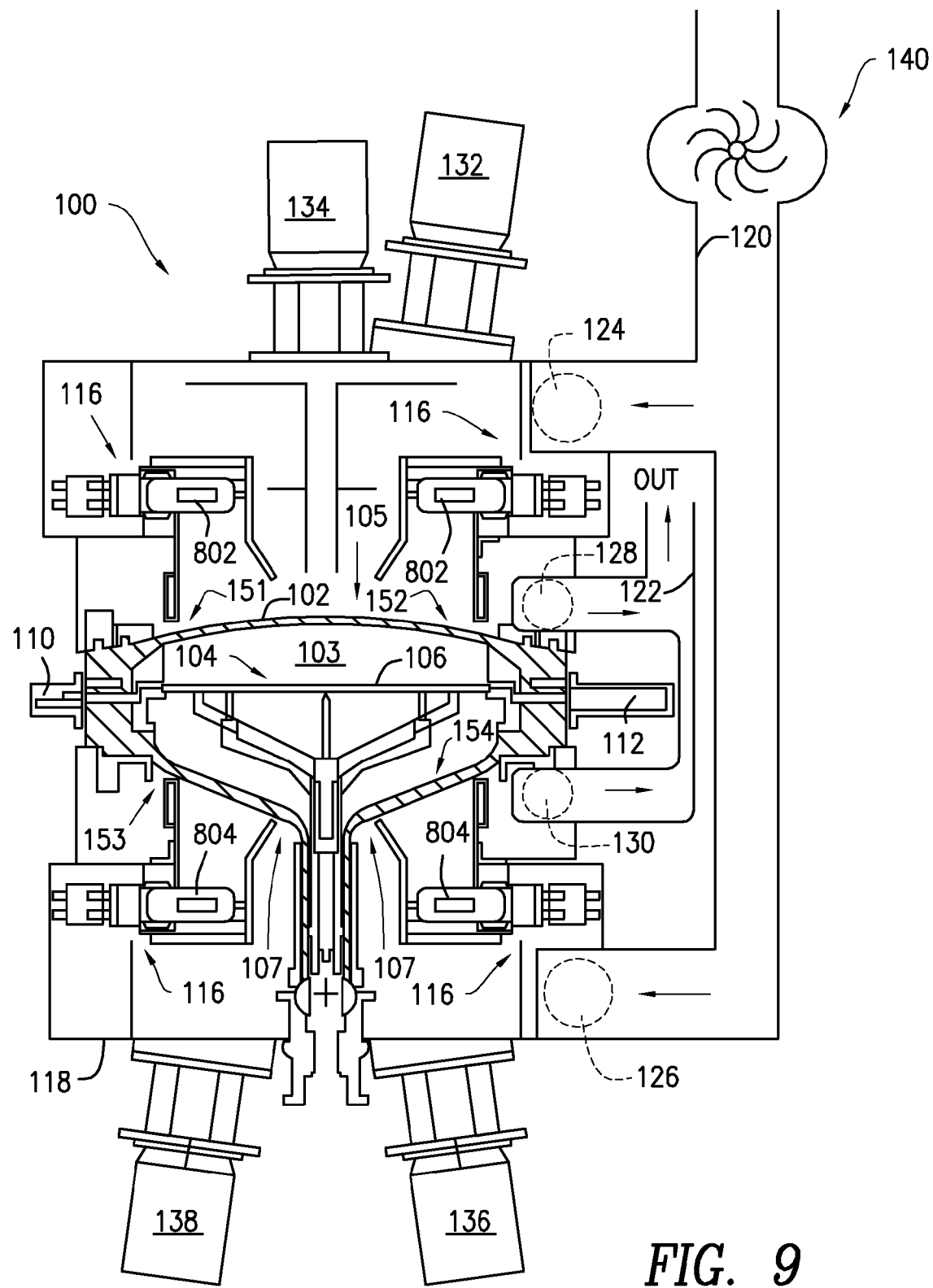
FIG. 9 shows a cross-sectional view of a fourth embodiment of a thermal reaction chamber.

With reference to FIG. 9, it is possible to independently control the temperature of the top surface 105 and the bottom surface 107 by changing the irradiancy bias between top lamps 802 and bottom lamps 804. The top lamps 802 are disposed above the top surface 105 of the chamber walls 102, and thus heat the top surface 105 while heating the substrate 106. The bottom lamps 804 are disposed below the bottom surface 107 of the chamber walls 102, and thus heat the bottom surface 107 while heating the substrate 106. The combined irradiancy of the top lamps 802 and bottom lamps 804 determines the final temperature of the substrate 106. If the irradiancy of the top lamps 802 is increased while the irradiancy of the bottom lamps 804 is decreased, it is possible to increase the temperature of the top surface 105 and decrease the temperature of the bottom surface 107, while keeping the substrate 106 at the same temperature. Reversing this irradiancy bias will lead to heating of the bottom surface 107 and cooling of the top surface 105, while maintaining the temperature of the substrate 106. The irradiancy of the top lamps 802 may therefore be controlled independent of the irradiancy of the bottom lamps 804. With reference to FIG. 6, independent control of the top lamps 802 and bottom lamps 804 permits the control circuit 500 to control the irradiancy bias between the top lamps 802 and bottom lamps 804. First cooling power control output 533 may thus be used to control the speed of variable speed blower 140, while second cooling power control output 534 may be used to control the irradiancy bias between the top lamps 802 and the bottom lamps 804. It will be appreciated that second cooling power control output 534 may actually be two independent outputs that respectively control the irradiancy of the top lamps 802 and the bottom lamps 804, and the difference between these two irradiancy outputs yields the irradiancy bias that preferentially heats and cools one of the surfaces 105, 107 over the other surface 107, 105.

For example, to cool the bottom surface 107, the processor 510 may control the second cooling power control output 534 so that the irradiancy of the top lamps 802 increases, while the irradiancy of the bottom lamps 804 decreases. From the temperature perspective of the substrate 106, little has changed. However, from the point of view of the bottom surface 107, as less radiant energy impinges upon the bottom surface 107, the bottom surface 107 will begin to cool. It will be appreciated that, since more radiant energy will impinge upon the top surface 105, the top surface 105 may begin to heat beyond its first temperature parameter 560. In response to this, the processor 510 may control the first cooling power control output 533 to increase the speed of the variable speed blower 140 to cool the top surface 105, which will incidentally lead to even more cooling of the bottom surface 107. Similarly, reversing the bias can lead to heating of the bottom surface 107. Hence, by using the second cooling power control output 534 to modulate the irradiancy bias between the lamps 802, 804, the processor can selectively raise or lower the temperature of the bottom surface 107 with respect to the top surface 105.

It is possible not only to temperature-modulate the top and bottom surfaces 105, 107 of the chamber walls 102, but also to modulate side portions of the chamber walls 102. For example, with reference to FIG. 1, with suitable control of inlet and outlet ducting, it is possible to control the respective temperatures of left adjacent top surface 151 and right adjacent top surface 152. The adjacent top surface 151, 152 are adjacent to the top surface 105, and hence adjacent to the top surface of the substrate 106. Similarly, it is possible to temperature-modulate left adjacent bottom surface 153 and right adjacent bottom surface 154, which are adjacent to the bottom surface 107, and hence adjacent to the bottom surface of the substrate 106. The control logic may be easily expanded to accommodate as many temperature parameters as there are individual chamber wall surface portions to temperature-modulate, and the method of doing so should be clear in light of this disclosure.

Although the invention herein has been described with reference to particular embodiments, it is to be understood that these embodiments are merely illustrative of the principles and applications of the present invention. It will be apparent to those skilled in the art that various modifications and variations can be made to the method of the present invention without departing from the spirit and scope of the invention. Thus, it is intended that the present invention include modifications and variations that are within the scope of the appended claims and their equivalents.

The invention claimed is:

1. A film formation system comprising:
a chamber wall defining an inner volume of a chamber to accept a substrate on which a film is to be formed;
a first cooling system to cool only a first portion of the chamber wall, the first portion of the chamber wall above the inner volume;
a first regulator to control cooling power of the first cooling system;
a first lamp to heat the first portion of the chamber wall;
a second cooling system to cool only a second portion of the chamber wall, the second portion of the chamber wall below the inner volume;
a second regulator to control cooling power of the second cooling system;
a second lamp to heat the second portion of the chamber wall;
an entry port to permit gas to enter the chamber to form the film on the substrate;
a controller containing an input for flow rate of the gas, the controller controlling the first regulator and the second regulator, the controller comprising: a memory to store the gas flow rate, a first temperature parameter defining a desired target temperature trajectory of the first portion of the chamber wall over a processing period and a second temperature parameter defining a desired target temperature trajectory of the second portion of the chamber wall over the processing period, the processing period including a film formation step, the target temperature trajectory being a non-constant value over the processing period; a user input/output system to enter the first temperature parameter; and a first output to control the first regulator to control the temperature of the first portion of the chamber walls during the processing period and a second output to control the second regulator to control the temperature of the second portion of the chamber walls during the processing period so that the temperature tracks the target temperature trajectory during film formation; and a processing circuit to send first signals to the first output and second signals to the second output over the processing period according to the first temperature parameter and to enhance growth rate of the film, the controller controlling an irradiancy bias between the first lamp and the second lamp to selectively heat the first wall relative to the second wall.

2. The system of claim 1, wherein the first temperature parameter comprises a plurality of setpoints, each setpoint comprising a respective time within the processing period.

3. The system of claim 2, wherein each setpoint further comprises a respective temperature.

4. The system of claim 2, wherein each setpoint further comprises a respective cooling power level.

5. The system of claim 1, further comprising a first temperature measurement device to measure the temperature of the first portion of the wall and a second temperature measurement device to measure the temperature of the second portion of the wall.

6. The system of claim 5, wherein the controller further comprises a first temperature input signal correlated to the temperature of the first portion of the wall, the first temperature input signal generated by the first temperature measurement device and a second temperature input signal correlated to the temperature of the second portion of the wall, the second temperature input signal generated by the second temperature measurement device.

7. The system of claim 6, wherein the first output is based on the first temperature input signal, the second temperature input signal or a function of the first temperature input signal and the second temperature input signal.

8. The system of claim 1, wherein the controller further comprises a feedback loop to control the power level of the first cooling system to cause a current measure of the wall temperature to match the temperature trajectory as a function of time.

9. The system of claim 5, wherein the temperature measurement devices are one or more of an optical pyrometer or a thermocouple.

10. The system of claim 1, wherein the first cooling system includes one or more of an air vane, adjustable iris, valve and blower.

11. The system of claim 1, wherein the first lamp and the second lamp collectively heat the substrate.

12. The system of claim 1, further comprising a first temperature measurement device to measure the temperature of the first portion of the wall and a second temperature measurement device to measure the temperature of the second portion of the wall.

13. The system of claim 12, wherein the temperature measurement devices are selected from the group consisting of optical pyrometers, thermocouples and combinations thereof.

14. The system of claim 1, wherein one or more of the first cooling system and the second cooling system use a coolant selected from the group consisting of air, water, nitrogen, helium, argon, inert gas and combinations thereof.

15. The system of claim 1, wherein the controller further comprises at least one feedback loop to control the power level of one or more of the first cooling system and the second cooling system to cause a current measure of the wall temperature to match the temperature trajectory as a function of time.

16. The system of claim 1, wherein the first cooling system and the second cooling system include one or more of an air vane, adjustable iris, valve or blower.

* * * * *